(12) United States Patent
Tsai et al.

(10) Patent No.: US 9,026,239 B2
(45) Date of Patent: May 5, 2015

(54) APC MODEL EXTENSION USING EXISTING APC MODELS

(75) Inventors: Po-Feng Tsai, Taipei (TW); Yen-Di Tsen, Chang-Ho (TW); Jo Fei Wang, Hsin-Chu (TW); Jong-I Mou, Hsinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1218 days.

(21) Appl. No.: 12/793,307

(22) Filed: Jun. 3, 2010

(65) Prior Publication Data

US 2011/0301736 A1    Dec. 8, 2011

(51) Int. Cl.
| | |
|---|---|
| G06F 19/00 | (2011.01) |
| G05B 11/01 | (2006.01) |
| G05B 17/02 | (2006.01) |
| G05B 15/00 | (2006.01) |
| H01L 21/66 | (2006.01) |

(52) U.S. Cl.
CPC ............... *G05B 17/02* (2013.01); *H01L 22/20* (2013.01)

(58) Field of Classification Search
CPC ............... G05B 19/41865; G05B 2219/45031; G05B 2219/32267; G05B 2219/32135
See application file for complete search history.

(56) References Cited

U.S. PATENT DOCUMENTS

| | | | | |
|---|---|---|---|---|
| 6,460,002 | B1 * | 10/2002 | Bone et al. ...................... 702/81 |
| 6,647,300 | B1 * | 11/2003 | Balasubramanian et al. .... 700/4 |
| 6,898,471 | B1 * | 5/2005 | Sun et al. ......................... 700/96 |
| 6,988,017 | B2 * | 1/2006 | Pasadyn et al. ................ 700/121 |
| 7,031,794 | B2 * | 4/2006 | Cheng et al. .................... 700/121 |
| 7,113,838 | B2 * | 9/2006 | Funk et al. ...................... 700/108 |
| 7,181,354 | B1 * | 2/2007 | Bone et al. ....................... 702/84 |
| 7,225,040 | B2 * | 5/2007 | Eller et al. ..................... 700/100 |
| 7,280,881 | B2 * | 10/2007 | Eller et al. ..................... 700/100 |
| 7,292,906 | B2 * | 11/2007 | Funk et al. ...................... 700/121 |
| 7,324,855 | B2 * | 1/2008 | Ushiku et al. .................... 700/83 |
| 7,346,412 | B2 * | 3/2008 | Tokorozuki et al. ........... 700/110 |
| 7,424,331 | B2 * | 9/2008 | Patel ............................... 700/31 |
| 7,556,899 | B2 * | 7/2009 | Ikeda et al. ...................... 430/22 |
| 8,229,588 | B2 * | 7/2012 | Tsen et al. ...................... 700/121 |
| 8,437,870 | B2 * | 5/2013 | Tsai et al. ...................... 700/110 |
| 2001/0034563 | A1 * | 10/2001 | Matsumoto et al. ........... 700/101 |
| 2006/0129257 | A1 * | 6/2006 | Chen et al. ....................... 700/96 |
| 2008/0233662 | A1 * | 9/2008 | Shen et al. ......................... 438/8 |

OTHER PUBLICATIONS

Jeff Schneider, Weighting Function, 1997, cs.cmu.edu, 4 pages.*

* cited by examiner

*Primary Examiner* — Kenneth Lo
*Assistant Examiner* — Sunray R Chang
(74) *Attorney, Agent, or Firm* — Slater and Matsil, L.L.P.

(57) ABSTRACT

A method of extending advanced process control (APC) models includes constructing an APC model table including APC model parameters of a plurality of products and a plurality of work stations. The APC model table includes empty cells and cells filled with existing APC model parameters. Average APC model parameters of the existing APC model parameters are calculated, and filled into the empty cells as initial values. An iterative calculation is performed to update the empty cells with updated values.

18 Claims, 6 Drawing Sheets

| | | WORK STATION | | |
|---|---|---|---|---|
| | | BESTL5#2 | NESTL8#1 | NESTL8#2 |
| PRODUCT | TMZ426 | 3.72 | 3.66 | 3.92 | 3.76 |
| | TMY182 | 1.85 | 1.73 | 1.96 | 1.84 |
| | TMY737 | 2.79 | 2.74 | 2.94 | 2.83 |
| | | 2.78 | 2.71 | 2.94 | |

FIG. 2

| PRODUCT | WORK STATION | | | | | | | | | |
|---|---|---|---|---|---|---|---|---|---|---|
| | BESTL3#2 | BESTL3#3 | BESTL5#2 | NESTL8#1 | NESTL8#2 | NESTL8#3 | NESTLA#1 | NESTLA#2 | NESTLA#3 | |
| TMY801 | 3.1155 | 5.0181 | 3.3393 | 3.3793 | 2.1977 | 3.1677 | 2.5538 | 1.5629 | 3.6 | 3.103811 |
| TMZ426 | 4.51715 | 5.0873 | 3.71515 | 3.6629 | 3.915175 | 3.83575 | | | | 4.122238 |
| TMU349 | 1.25 | 1.25 | 0.451 | 0.7843 | 1.25 | -0.2795 | | | | 0.7843 |
| TMY182 | 2.54 | 3.38 | 1.8468 | 1.728275 | | 2.162675 | | | | 2.33155 |
| TMY737 | 3.4616 | 4.6836 | 2.7874 | 3.335659 | 2.943494 | 2.8022 | | | | 3.335659 |

FIG. 4

| PRODUCT | WORK STATION | | | | | | | | |
|---|---|---|---|---|---|---|---|---|---|
| | BESTL3#2 | BESTL3#3 | BESTL5#2 | NESTL8#1 | NESTL8#2 | NESTL8#3 | NESTLA#1 | NESTLA#2 | NESTLA#3 |
| TMY801 | 3.1155 | 5.0181 | 3.3393 | 3.3793 | 2.1977 | 3.1677 | 2.5538 | 1.5629 | 3.6 |
| TMZ426 | 4.51715 | 5.0873 | 3.71515 | 3.6629 | 3.915175 | 3.83575 | 4.122238 | 4.122238 | 4.122375 |
| TMU349 | 1.25 | 1.25 | 0.451 | 0.7843 | 1.25 | -0.2795 | 0.7843 | 0.7843 | 0.7843 |
| TMY182 | 2.54 | 3.38 | 1.8468 | 1.728275 | 2.33155 | 2.162675 | 2.33155 | 2.33155 | 2.3315502 |
| TMY737 | 3.4616 | 4.6836 | 2.7874 | 3.335659 | 2.943494 | 2.8022 | 3.335659 | 3.335659 | 3.3356587 |

| | | WORK STATION | | | | |
|---|---|---|---|---|---|---|
| | | BESTL5#2 | NESTL8#1 | NESTL8#2 | | |
| PRODUCT | TMZ426 | 3.72 | 3.66 | 3.92 | 3.76 | ROW 1 |
| | TMY182 | 1.85 | 1.73 | | 1.79 | ROW 2 |
| | TMY737 | 2.79 | | 2.94 | 2.87 | ROW 3 |
| | | COLUMN 1 | COLUMN 2 | COLUMN 3 | | |

FIG. 5B

| | | WORK STATION | | |
|---|---|---|---|---|
| | | BESTL5#2 | NESTL8#1 | NESTL8#2 |
| PRODUCT | TMZ426 | 3.72 | 3.66 | 3.92 |
| | TMY182 | 1.85 | 1.73 | 1.79 |
| | TMY737 | 2.79 | 2.87 | 2.94 |

FIG. 5C

| | | WORK STATION | | | |
|---|---|---|---|---|---|
| | | BESTL5#2 | NESTL8#1 | NESTL8#2 | |
| PRODUCT | TMZ426 | 3.72 | 3.66 | 3.92 | 3.76 |
| | TMY182 | 1.85 | 1.73 | 1.79 | 1.79 |
| | TMY737 | 2.79 | 2.87 | 2.94 | 2.87 |
| | | 2.78 | 2.75 | 2.88 | |

FIG. 5D

| | | WORK STATION | | | |
|---|---|---|---|---|---|
| | | BESTL5#2 | NESTL8#1 | NESTL8#2 | |
| PRODUCT | TMZ426 | 3.72 | 3.66 | 3.92 | 3.76 |
| | TMY182 | 1.85 | 1.73 | 1.96 | 1.84 |
| | TMY737 | 2.79 | 2.74 | 2.94 | 2.83 |
| | | 2.78 | 2.71 | 2.94 | |

FIG. 5E

| | | WORK STATION | | | |
|---|---|---|---|---|---|
| | | BESTL5#2 | NESTL8#1 | NESTL8#2 | |
| PRODUCT | TMZ426 | 3.72 | 3.66 | 3.92 | 3.76 |
| | TMY182 | 1.85 | 1.73 | 1.99 | 1.85 |
| | TMY737 | 2.79 | 2.70 | 2.94 | 2.81 |
| | | 2.78 | 2.70 | 2.95 | |

FIG. 5F

| | | WORK STATION | | | |
|---|---|---|---|---|---|
| | | BESTL5#2 | NESTL8#1 | NESTL8#2 | |
| PRODUCT | TMZ426 | 3.72 | 3.66 | 3.92 | 3.76 |
| | TMY182 | 1.85 | 1.73 | 2.00 | 1.86 |
| | TMY737 | 2.79 | 2.69 | 2.94 | 2.81 |
| | | 2.78 | 2.70 | 2.95 | |

FIG. 5G

| | | WORK STATION | | | |
|---|---|---|---|---|---|
| | | BESTL5#2 | NESTL8#1 | NESTL8#2 | |
| PRODUCT | TMZ426 | 3.72 | 3.66 | 3.92 | 3.76 |
| | TMY182 | 1.85 | 1.73 | 2.00 | 1.86 |
| | TMY737 | 2.79 | 2.69 | 2.94 | 2.81 |
| | | 2.78 | 2.69 | 2.95 | |

FIG. 6

| PRODUCT | WORK STATION | | | | | PRODUCT COVERAGE RATIO |
|---|---|---|---|---|---|---|
| | BESTL3#2 | BESTL3#3 | BESTL5#2 | NESTL8#1 | NESTLA#3 | |
| TMY801 | 3.1155 | 5.0181 | 3.3393 | 3.3793 | 3.6 | 3/3 = 100% |
| TMZ426 | 4.51715 | 5.0873 | 3.71515 | 3.6629 | | 3/3 = 100% |
| TMU349 | 1.25 | 1.25 | 0.451 | | | 3/3 = 100% |
| WORK STATION COVERAGE RATIO | 3/3 = 100% | 3/3 = 100% | 3/3 = 100% | 2/3 = 67% | 1/3 = 33% | |

5/5 = 100%
4/5 = 80%
3/5 = 60%

APC MODEL EXTENSION USING EXISTING APC MODELS

TECHNICAL FIELD

This disclosure relates generally to integrated circuit manufacturing processes, and particularly to advanced process control (APC) of integrated circuit manufacturing processes, and more particularly to APC model extension using existing models.

BACKGROUND

The manufacturing of integrated circuits includes many processes such as deposition processes, chemical mechanical polish (CMP) processes, etching processes, and the like. To fine tune the processes, advanced process control (APC) is needed, so that the processes may be fine tuned to suit for different products, recipes, layers, production tools, and the like.

Due to the enormous number of combinations of different products, recipes, layers, and production tools, the number of APC model parameters that characterizing the respective APC models is also significant. Therefore, it is impossible to provide APC model parameters for all of the combinations. Accordingly, some products will not have APC model parameters for them to be processed by some production tools. This will cause un-balanced usage of the production tools since wafers will be dispatched to production tools that have already had APC model parameters for processing these wafers. Some of the production tools may have long queues of wafers waiting for them to process, while some other production tools may stay idle since these production tools do not have the required APC model parameters for them to process these wafers.

For a production tool to start processing wafers of certain products, initial APC model parameters need to be provided before they are updated with more accurate APC model parameters. Currently, the initial APC model parameters are estimated by engineers. Accordingly, the accuracy of the estimated APC model parameters is affected by the experience of the engineers. If the estimated APC model parameters are not correct, the resulting wafers will have poor quality, and the processed wafers may have to be scraped. In addition, the manual estimation of the APC model parameters requires significant amount of man power.

SUMMARY

In accordance with one aspect, a method of extending advanced process control (APC) models includes constructing an APC model table including APC model parameters of a plurality of products and a plurality of work stations. The APC model table includes empty cells and cells filled with existing APC model parameters. Average APC model parameters of the existing APC model parameters are calculated, and filled into the empty cells as initial values. An iterative calculation is performed to update the empty cells with updated values.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIG. 2 illustrates an advanced process control (APC) model table including table cells filled with existing APC model parameters and empty cells;

FIG. 3 illustrates a work flow for extending APC models from existing APC models;

FIG. 4 illustrates an initialized APC model table;

FIGS. 5A through 5G illustrate the initialization and the iterative calculation of values in an APC model table; and FIG. 6 illustrates coverage ratios of an APC model table.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1:
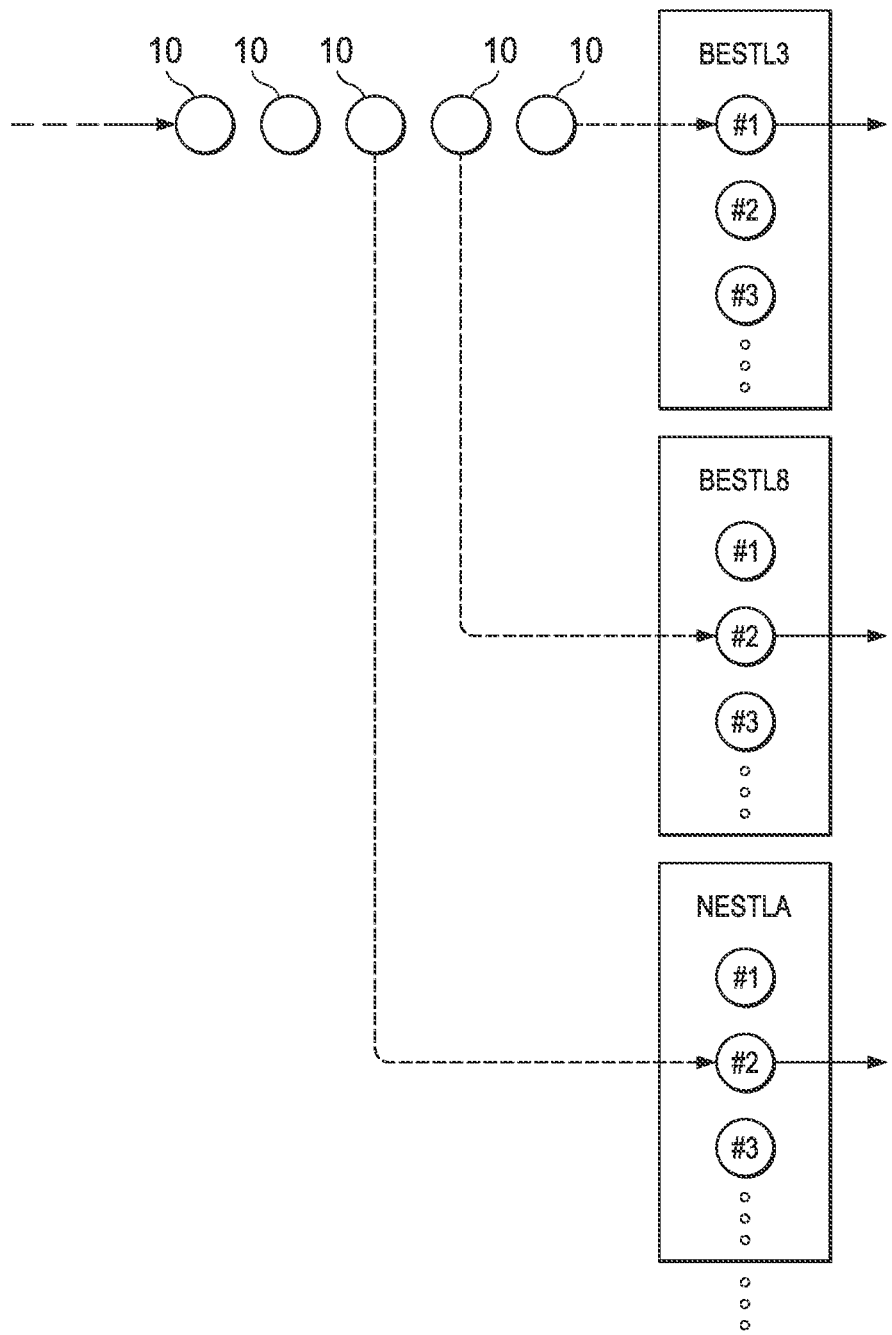
FIG. 1 illustrates a plurality of wafers to be dispatched to a plurality of work stations, so that a process step may be performed to the wafers.

A novel method of extending advanced process control (APC) models to empty models is provided. The intermediate stages of various embodiments are illustrated. FIG. 1 illustrates the dispatching of a plurality of wafers 10 that is to be processed in a process step. The plurality of wafers 10 belongs to a same product. Different products may have different circuit designs and or belong to different customers, while wafers of the same product have the same circuit design. The process step may be a deposition step, a chemical mechanical polish (CMP) step, an etching step, or any other integrated circuit manufacturing step that involves APC. A plurality of production tools, each named with an identifier, such as BESTL3, BESTL8, NESTLA, and the like, is used to perform the process step. Further, each of the production tools BESTL3/BESTL8/NESTLA may include one or more chambers (or any other type of sub tools), which may be identified as chambers #1, #2, #3, or the like. The chambers in production tools BESTL3/BESTL8/NESTLA are configured to perform the same process step, such as the CMP. Accordingly, each of wafers 10 may be dispatched to one of chambers #1, #2, and #3 in any one of production tools BESTL3/BESTL8/NESTLA. Throughout the description, the combination of the production tool and the chamber is referred to as a work station. For example, work station BESTL3#1 refers to chamber #1 in production tool BESTL3.

FIG. 2 illustrates a table of APC model parameters, with each of the APC model parameters characterizing (or representing) an APC model for a specific product to be processed by a work station. In exemplary embodiments, each row in the APC model table corresponds to a product, and each column corresponds to a work station. It is realized, however, that the concepts of "row" and "column" are interchangeable, depending on how the table is viewed. The filled values are the existing APC model parameters whose APC models have already been constructed and known. The empty cells correspond to empty APC models that do not have APC model parameters. In order to dispatch a wafer of a product (for example, product TMZ426) to a work station (for example, NESTLA#1), the respective APC model parameter must be constructed first, so that the APC model parameter may be used to control the work station for the APC. In the embodiments, a method of extending from existing (known) APC models to empty APC models is provided. Throughout the description, an APC model that is currently empty, and is to be (or has already been) constructed from existing APC models is referred to an extended APC model. The respective product is referred to as a target product, and the respective work station is referred to as a target work station. For example, in the above-discussed example, product TMZ426 is the target product, work station NESTLA#1 is the target work station, and the model corresponding to the table cell of product TMZ426 and work station NESTLA#1 is the extended APC model.

Figures 3, 5A:
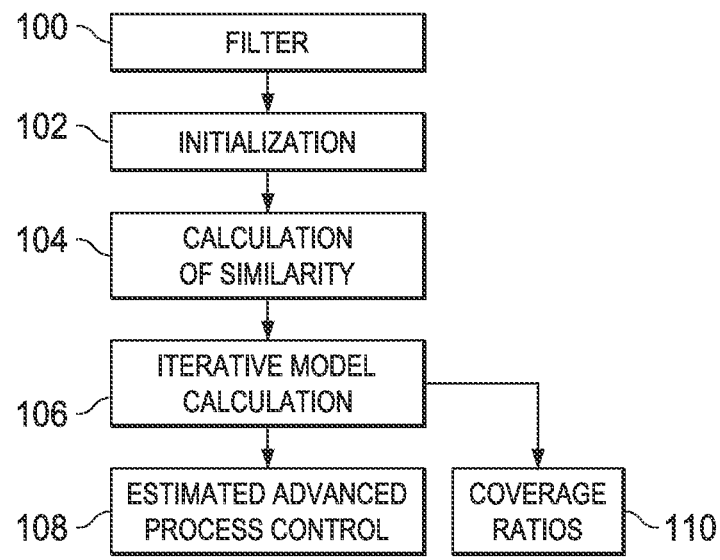

FIG. 3 illustrates a work flow for extending APC models. To ensure the accuracy of the extended APC models, the model extension need to be started from existing APC models that are highly correlated to the extended APC models. Accordingly, referring to FIG. 3, the existing APC models are filtered (step 100), and APC models that are correlated to the extended APC models are selected and used in the model extension, while those APC models that may not be correlated to the extended APC models are not selected. To perform the filtering, a plurality of candidate products and work stations are selected from a data collection and filtered. The filtering may take into various factors, such as product groups. If a product is in a product group the same or similar to the target product, it may be correlated to the target product, and may be selected. Therefore, products in different product groups than the target product will not be selected. For example, a static random access memory (SRAM) product is not selected if the target product is a logic circuit product.

For a CMP, the similarity in pattern densities also affects the correlation, and existing APC models whose products have a similar pattern density as the target product may be used for the APC model extension. Additional factors affecting the filtering include the counts of APC model update, and the more times an APC model is updated, the more accurate the APC model is expected to be. Accordingly, APC models with greater numbers of update counts are used for the APC model extension, while APC models with smaller numbers of update counts are not used. In an exemplary embodiment, the products whose APC models have been updated three times or more may be selected, while the products whose APC models have been updated fewer than three times are not selected. Further, if an APC model is for a layer of a product same as the layer of the target product, on which layer the manufacturing process is to be performed, then the product may be selected. Otherwise, it may not be selected. Additional filtering factors include the similarity in process recipes. Further, the age of the exiting APC models may also be filtered. For example, exiting APC models that have not been updated more than 45 days may not be selected, while exiting APC models within 45 days may be selected.

After the filtering of APC models, an APC model table may be constructed, and includes correlated products selected in step 100. An exemplary APC model table is shown in FIG. 2. For example, wafers of product TMZ426 need to be dispatched to work station NESTLA#1. However, the respective APC model is empty. Accordingly, a filtering (step 100 in FIG. 2) is performed using the criteria as discussed, and products TMY801, TMU349, TMY182, and TMY737 are selected as the correlated products, whose existing APC models are used to generate an extended APC model for product TMZ426 on work station NESTLA#1.

Referring to step 102 in FIG. 3, an initialization is performed to fill in the empty cells in the APC model table with initial APC model parameters. Referring to FIG. 2, the rightmost column illustrates the calculated averages of the existing model parameters, with each of the averages being obtained by averaging all existing APC model parameters in the table and belonging to the same product. In FIG. 4, the average APC model parameters are filled into the empty cells as initial APC model parameters. It is realized that average APC model parameters may also be calculated by averaging existing APC model parameters of the same work stations. However, the differences between products are generally greater than the differences between work stations. Therefore, averaging exiting model parameters of the same product may result in better results.

Referring to step 104 in FIG. 3, even if FIG. 4 includes the filtered products, the filtered products may still have different similarities as the target product. For example, for a CMP process, if product TMZ426 has a pattern density of 0.05, then product TMY801 whose pattern density is 0.051 has a better similarity with product TMZ426 than product TMU349, whose pattern density is 0.055. The similarity may also be evaluated according to other criteria such as product groups, layers, recipes, counting of APC model updates, aging, and the like. Accordingly, weightings may be assigned to the correlated products and work stations (or assigned to the selected APC models), and used in the APC model extension. The model parameters of the products and work stations having greater weightings affect the resulting extended APC models more than those having smaller weightings. The weightings may be assigned in a binary manner, which is either 1 or 0, or assigned as a Gauss function and normalized so that the weightings may be between 0 and 1.

Next, as shown in step 106 in FIG. 3, an iterative model calculation is performed to iteratively calculate the extended APC model parameters, until the extended APC model parameters converge. The values resulted from the iterative calculation are the APC model parameters of the extended APC models (step 108).

An example of extending the APC models and the iterative calculation is shown in FIGS. 5A through 5G. The APC table shown in FIG. 5A is similar to what is shown in FIG. 2, except it contains fewer rows and columns than table 2, so that the concept of the present disclosure may be understood easily. The APC model table in FIG. 5A includes three rows denoted as row 1, row 2, and row 3, each corresponding to a product, and three columns denoted as column 1, column 2, and column 3, each corresponding to a work station. Among the nine table cells, seven table cells are filled with existing APC model parameters, and two table cells are empty cells that need to be extended. The values in the rightmost column outside the table are averages for rows, wherein the averaging is performed on the APC model parameters of the same products.

FIG. 5B illustrates the filling of the averages shown in FIG. 5A into the empty cells in the respective rows. Next, a calculation is performed iteratively starting from the values in the table shown in FIG. 5B to update the initial values in the empty cells, until the updated values converge (step 106 in FIG. 3). Equation 1 is used for the iterative calculation to calculate extended APC model parameters, and is expressed as:

$$M(i, j) = \frac{m}{m-1} \sum_{k=1, k \neq i}^{n} \omega_k M(k, j) + \frac{n}{n-1} \sum_{p=1, p \neq j}^{m} \omega_p M(i, p) - n*m*\overline{\mu}_{without\ M(i,j)} \quad [\text{Eq. 1}]$$

Wherein $M(i, j)$ represents the value in a table cell in row i and column j of the APC model table, n is the total number of rows of the APC model table, m is the total number of columns of the APC model table, $\omega_k$ is the similarity weighting of the product corresponding to row k, $\omega_p$ is the similarity weighting of the work station corresponding to column p, and $\bar{\mu}_{withoutM(i,j)}$ is the average of table cells excluding the values in table cell (i, j).

Using Equation 1, the estimated model parameters of the empty cells may be calculated and updated in a plurality of iterations. For example, using Equation 1 with i=2 and j=3, the value in table cell M(2, 3) may be calculated as 1.96 by equally taking all similarity weights to be 1. The value in table cell M(2, 3) is thus updated from 1.79 to 1.96. Similarly, using Equation 1 with i=3 and j=2, the value in table cell M(3, 2) may be calculated, and value 2.87 is replaced with value 2.74. The calculation and the updating are shown in FIGS. 5C and 5D. In FIG. 5C, the averages of each of rows and columns are calculated, and marked outside the table. The averages may then be used in the calculation. After the values in table 5D is obtained, another iteration is performed starting from the table in FIG. 5D, wherein the iteration is also performed using Equation 1 to recalculate the values in table cells M(2, 3) and M(3, 2). The result is shown in FIG. 5E. FIGS. 5F and 5G illustrate the results obtained through more iterations, with the values in FIG. 5F obtained starting from FIG. 5E, and the values in FIG. 5G obtained starting from FIG. 5F. The iterations may be ended after a certain number, for example, four, of iterations are performed. Alternatively, the iterations may be ended after the difference between table values obtained in successive iterations has converged to equal to or less than a pre-determined percentage, for example, one percent. For example, the value of cell M(2, 3) in the table shown in FIG. 5E is 1.99, and the value of table M(2, 3) in the table shown in FIG. 5F is 2.00. The different between 1.99 and 2.00 is less than 1 percent of any of 1.99 and 2.00. The iterations may thus be stopped after the iteration shown in FIG. 5F.

Through the iterative calculation shown in FIGS. 5A through 5G, the extended APC model parameter for processing the wafers of product TMY182 on work station NESTL8#2 is obtained as 2.00, and the extended APC model parameter for processing the wafers of product TMY737 on work station NESTL8#1 is 2.69. The extension of APC model parameters is thus finished, and the extended APC model parameters may be used to control the APC in order to fine tune the process. The wafers of product TMY182 (FIGS. 5F and 5G) may be dispatched to work station NESTL8#2, and processed using APC model parameter 2.00, and wafers of product TMY737 may be dispatched to work station NESTL8#1, and processed using APC model parameter 2.69.

Referring back to step 110 in FIG. 3, the quality of the extended APC model parameters may be evaluated using coverage ratios. For example, FIG. 6 illustrates a table of APC model parameters, with filled values representing existing APC models. The values outside the tables represent the work station coverage ratios for rows (products) and product coverage ratios for columns (work stations). Higher coverage ratios represent higher quality of extended APC models (after they are extended), and the respective APC models may be used with a higher confidence over others. For example, if wafers of product TMU349 is dispatched to work station NESTL8#1 and processed using a respective extended APC model parameter, the work station coverage ratio is 60 percent, while the product coverage ratio is 67 percent. As a comparison, if wafers of product TMU349 is dispatched to work station NESTLA#3 and processed using a respective extended APC model parameter, the work station coverage ratio is 60 percent, while the product coverage ratio is only 33 percent. Accordingly, between choices of NESTL 8#1 and NESTLA#3, it is preferred that wafers of product TMU349 is dispatched to work station NESTL8#1. Further, the table in FIG. 6 has an overall coverage ratio, which is the ratio of the total number of existing APC models to the total number of cells in the table. In the exemplary embodiment shown in FIG. 6, the average coverage ratio is 12/15, which is 80 percent, which indicates that the extended APC model parameters in this table have a reasonably high quality.

By using the embodiments, APC model parameters may be extended from existing APC model parameters. Through the quality control of the knowledge-based filtering, the similarity-base weighting strategy, the iterative model calculation, and the confident indices (coverage ratios), the quality of the extended APC model parameters may be well controlled, resulting in a faster APC determination and a better APC performance.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    constructing an advanced process control (APC) model table comprising APC model parameters of a plurality of products and a plurality of work stations, with the plurality of products and the plurality of work stations as rows and columns of the APC model table, wherein the APC model table comprises empty cells and cells filled with existing APC model parameters;
    calculating average APC model parameters of the existing APC model parameters;
    filling the empty cells with the average APC model parameters as initial values;
    evaluating a weighting for each of the plurality of products, wherein the weighting is between 0 and 1;
    performing an iterative calculation using the weighting to update the empty cells with updated values; and
    using one of the updated values to control one of the plurality of work stations to process a wafer of one of the plurality of products, with the one of the updated values being corresponding to the one of the plurality of work stations and the one of the plurality of products in the APC model table.

2. The method of claim 1, wherein the APC model table is arranged with each row or column representing a product, and each column or row representing a work station.

3. The method of claim 1 further comprising:
    providing a target product;

providing a target work station for dispatching wafers of the target product to, wherein no APC model corresponding to the target product and the target work station is provided;

providing a plurality of candidate products;

performing a filtering to the plurality of candidate products to select a plurality of correlated products more correlated to the target product than unselected ones in the plurality of candidate products; and performing the step of constructing the APC model table, with the APC model table comprising the plurality of correlated products and the target product as rows, and the target work station as a column.

4. The method of claim 3, wherein the step of calculating the average APC model parameters is performed by averaging existing APC model parameters for each of the plurality of correlated products and the target product.

5. The method of claim 1, wherein the iterative calculation is performed using equation:

$$M(i, j) = \frac{m}{m-1} \sum_{k=1, k \neq i}^{n} \omega_k M(k, j) + \frac{n}{n-1} \sum_{p=1, p \neq j}^{m} \omega_p M(i, p) - n*m*\overline{\mu}_{without\, M(i,j)}$$

Wherein $M(i, j)$ represents one of the updated values of a table cell in row i and column j of the APC model table, n is the total number of rows of the APC model table, m is the total number of columns of the APC model table, $\omega_k$ is a weighting of a product corresponding to row k, $\omega_p$ is a weighting of a work station corresponding to column p, and $\overline{\mu}_{without M(i,j)}$ is an average of table cell values excluding the value in the table cell in the row i and the column j, and wherein each of m and n is equal to or greater than 2.

6. The method of claim 1, wherein the iterative calculation comprises:

predetermining a percentage value;

continuing the step of the iterative calculation when the updated values obtained in successive iterations have differences greater than the percentage value; and stopping the step of the iterative calculation when the updated values obtained in successive iterations have differences equal to or less than the percentage value.

7. The method of claim 1, wherein the iterative calculation is stopped when a count of iterations in the iterative calculation is greater than a pre-determined value.

8. A method comprising:

providing a target product;

providing a target work station for dispatching wafers of the target product to;

providing a plurality of candidate products;

performing a filtering to the plurality of candidate products to select a plurality of correlated products according to correlation degrees between the plurality of candidate products and the target product;

constructing an advanced process control (APC) model table comprising APC model parameters as table cells, with the plurality of correlated products and the target product being rows or columns of the APC model table, and a plurality of work stations and the work station being columns or rows of the APC model table, wherein a cell in the APC model table and corresponding to the target product and the target work station is an empty cell;

calculating an average APC model parameter by averaging known APC model parameters of the target product;

filling the empty cell with the average APC model parameter as an initial value;

performing an iterative calculation to update the empty cell with updated values; and dispatching a wafer to the target work station to process the wafer, wherein the wafer belongs to the target product in the plurality of products, wherein one of the updated values is used to control the target work station to process the wafer.

9. The method of claim 8 further comprising:

averaging existing APC model parameters for each of the plurality of correlated products to obtain a plurality of averages; and filling empty cells of the plurality of correlated products with respective ones of the plurality of averages.

10. The method of claim 8 further comprising evaluating a weighting for each of the plurality of correlated products, with the weighting being used in the step of performing the iterative calculation, wherein the weighting is between 0 and 1.

11. The method of claim 8, wherein the iterative calculation comprises:

predetermining a percentage value;

continuing the step of the iterative calculation when the updated values obtained in successive iterations have differences greater than the percentage value; and stopping the step of the iterative calculation when the updated values obtained in successive iterations have differences equal to or less than the percentage value.

12. The method of claim 8, wherein the iterative calculation is stopped when a count of iterations of the iterative calculation is greater than a pre-determined value.

13. The method of claim 8, wherein the iterative calculation is performed using equation:

$$M(i, j) = \frac{m}{m-1} \sum_{k=1, k \neq i}^{n} \omega_k M(k, j) + \frac{n}{n-1} \sum_{p=1, p \neq j}^{m} \omega_p M(i, p) - n*m*\overline{\mu}_{without\, M(i,j)}$$

Wherein $M(i, j)$ represents a value in a table cell in row i and column j of the APC model table, n is the total number of rows of the APC model table, m is the total number of columns of the APC model table, $\omega_k$ is a weighting of a product corresponding to row k, $\omega_p$ is a weighting of a work station corresponding to column p, and $\overline{\mu}_{without M(i,j)}$ is an average of table cell values excluding the value in the table cell in row the i and the column j, and wherein each of m and n is equal to or greater than 2.

14. A method comprising:

constructing an advanced process control (APC) model table comprising APC model parameters of a plurality of products and a plurality of work stations, wherein the APC model table comprises empty cells and non-empty cells filled with existing APC model parameters;

calculating average APC model parameters of the existing APC model parameters, with each of the average APC model parameters being calculated by averaging known APC model parameters of one of the plurality of products;

filling the empty cells with the average APC model parameters as initial values;

performing an iterative calculation to update the empty cells with updated values; and dispatching a wafer to a work station to process the wafer, wherein the wafer belongs to a product in the plurality of products, wherein a model parameter used in the step of processing the wafer is generated by the step of the iterative calculation, wherein the step of dispatching the wafer comprises evaluating a coverage ratio of the product on the plurality of work stations, with the coverage ratio of the product being equal to a total number of non-empty cells corresponding to the product divided by a total number of the plurality of work stations, and dispatching the wafer to the work station with a higher coverage ratio than other work stations in the plurality of work stations.

15. The method of claim 14, wherein the APC model table is arranged with each row representing a product, and each column representing a work station.

16. The method of claim 14 further comprising evaluating a weighting for each of the plurality of products, with the weighting being used in the step of performing the iterative calculation.

17. The method of claim 14, wherein the iterative calculation is stopped when a count of iterations in the iterative calculation is greater than a pre-determined count.

18. The method of claim 14, wherein a coverage ratio of one of the plurality of work stations is calculated as a total number of the filled cells corresponding to the one of the plurality of work stations divided by a total number of the plurality of products.

* * * * *